United States Patent
Tanaka et al.

(10) Patent No.: US 9,246,306 B2
(45) Date of Patent: Jan. 26, 2016

(54) SEMICONDUCTOR LASER ELEMENT AND METHOD OF MANUFACTURING THE SAME

(71) Applicant: NICHIA CORPORATION, Anan-shi (JP)

(72) Inventors: Atsushi Tanaka, Tokushima (JP); Mitsuhiro Nonaka, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/500,658

(22) Filed: Sep. 29, 2014

(65) Prior Publication Data

US 2015/0092804 A1    Apr. 2, 2015

(30) Foreign Application Priority Data

Sep. 30, 2013    (JP) .................................. 2013-205924

(51) Int. Cl.
*H01S 3/00*    (2006.01)
*H01S 5/042*    (2006.01)
*H01S 5/02*    (2006.01)
*H01S 5/22*    (2006.01)
*H01S 5/323*    (2006.01)

(52) U.S. Cl.
CPC ............. *H01S 5/0425* (2013.01); *H01S 5/0201* (2013.01); *H01S 5/22* (2013.01); *H01S 5/32341* (2013.01)

(58) Field of Classification Search
CPC .................................. H01S 5/0201; H01S 5/02
USPC ............................................................ 438/22
See application file for complete search history.

(56) References Cited

U.S. PATENT DOCUMENTS

2007/0202664 A1    8/2007    Aoki
2011/0189798 A1    8/2011    Aoki

FOREIGN PATENT DOCUMENTS

| JP | S60-18928 |    | 1/1985 |
|----|-----------|----|--------|
| JP | S60-058690 | * | 4/1985 |
| JP | H05-315207 | * | 11/1993 |
| JP | H06-349691 |    | 12/1994 |
| JP | H07-045484 |    | 2/1995 |
| JP | 2007-243132 |    | 9/2007 |
| JP | 5298141 |    | 6/2011 |

* cited by examiner

*Primary Examiner* — Tuan Nguyen
(74) *Attorney, Agent, or Firm* — Foley & Lardner LLP

(57) ABSTRACT

A semiconductor laser element includes a substrate; a semiconductor layer formed on a front surface of the substrate; a first electrode formed on a back surface of the substrate; a second electrode formed on a front surface of the semiconductor layer; and at least one mark configured to allow reading of predetermined information, the at least one mark being formed in at least one of (i) a position on the surface on which the first electrode is formed, spaced apart from the first electrode and (ii) a position on the surface on which the second electrode is formed, spaced apart from the second electrode. The at least one mark is made of a metal material and has a thickness smaller than a thickness of the electrode that is formed on the surface on which the at least one mark is formed.

20 Claims, 12 Drawing Sheets

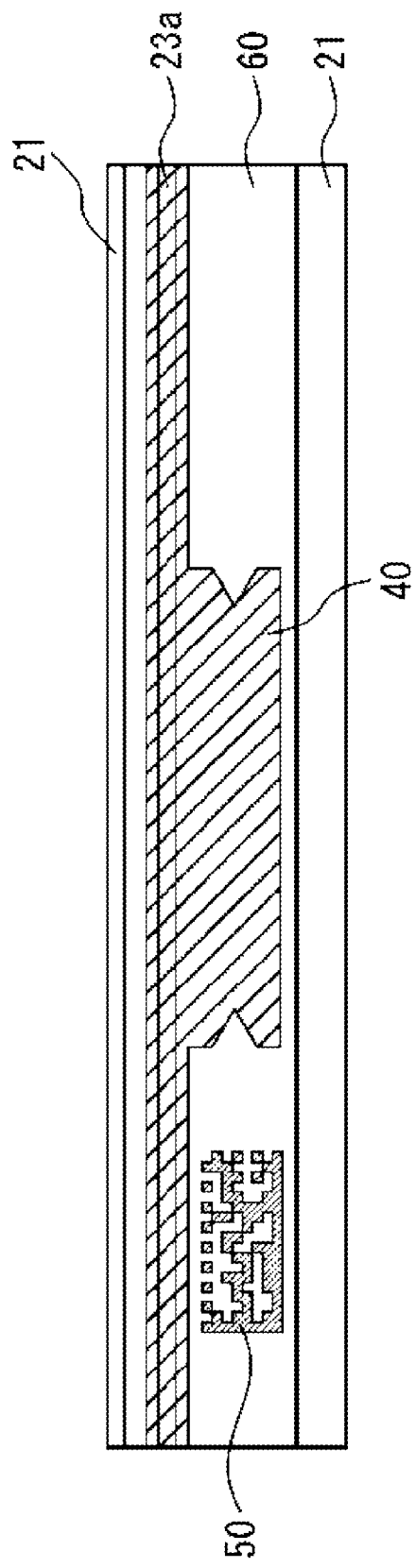

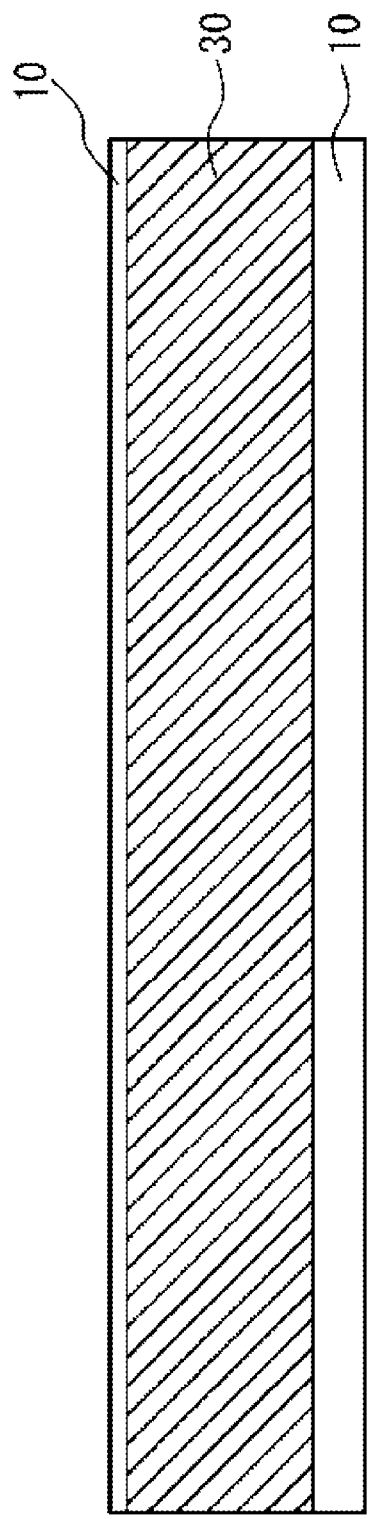

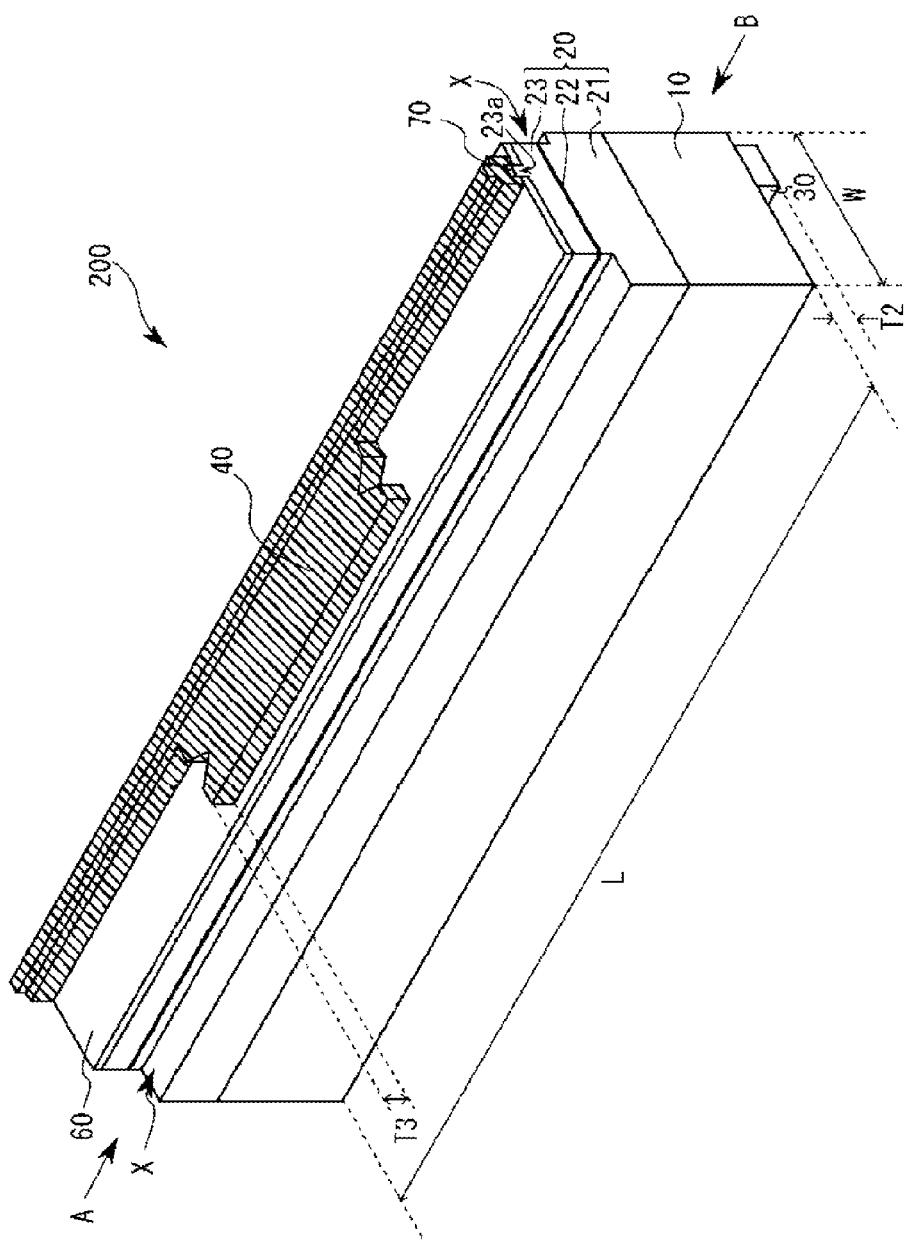

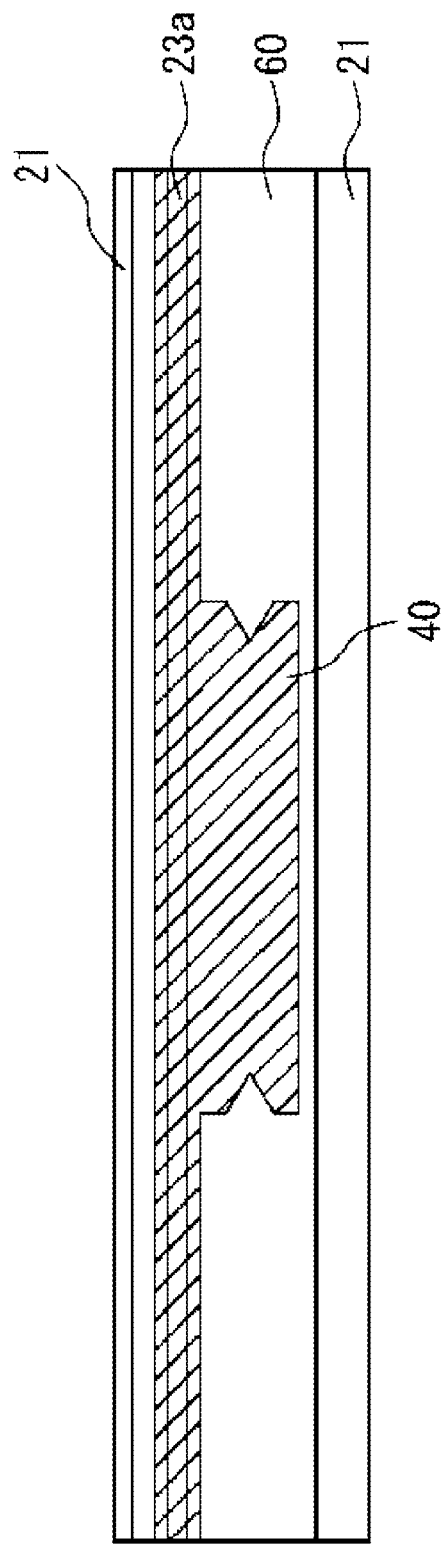

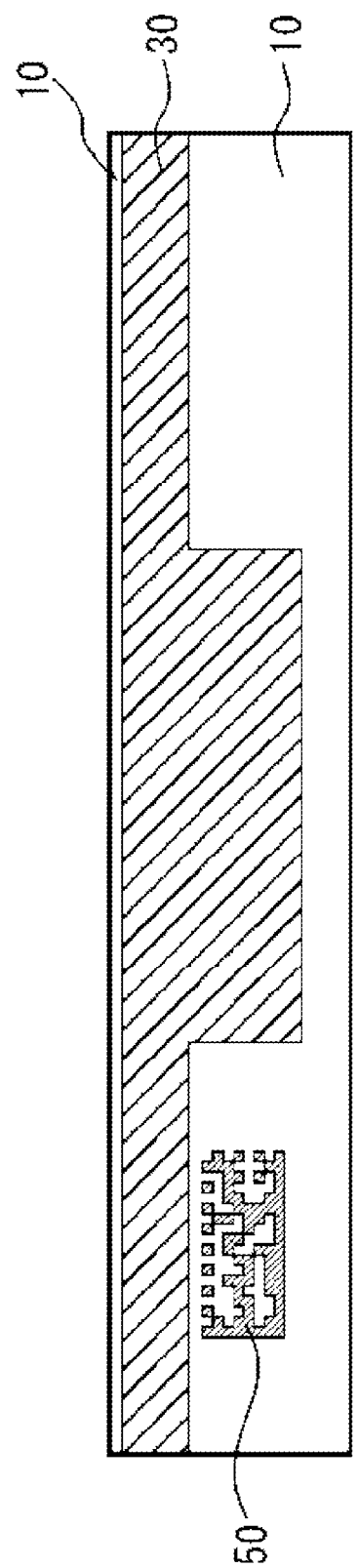

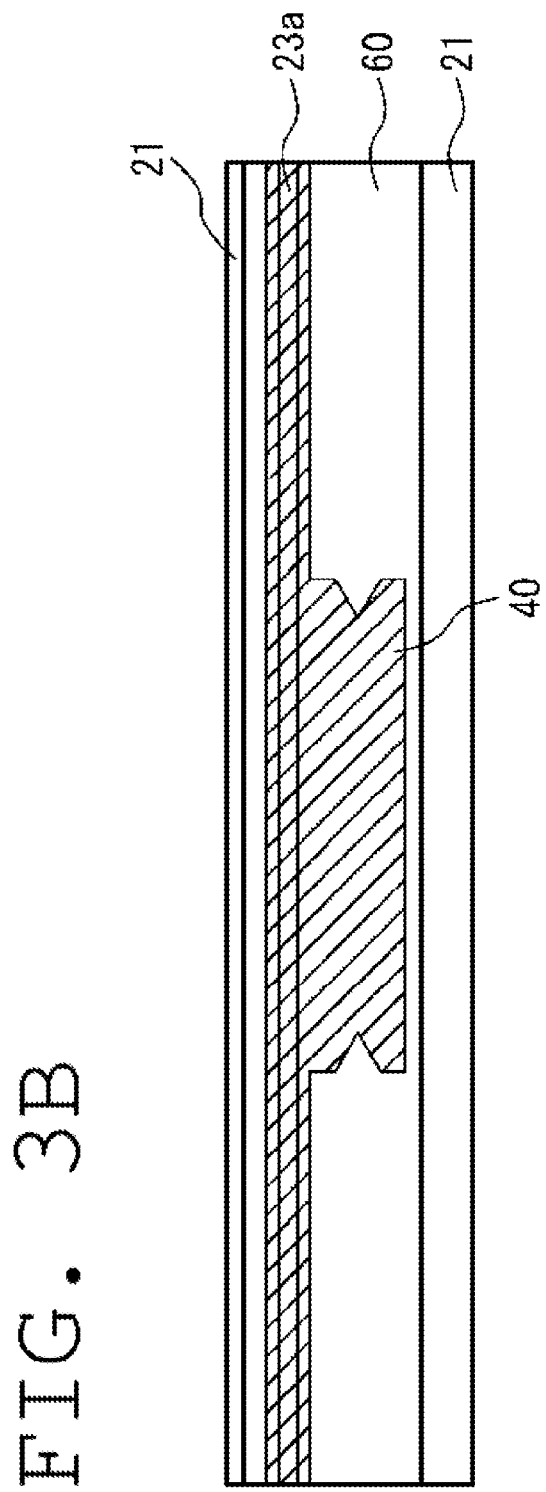

SEMICONDUCTOR LASER ELEMENT AND METHOD OF MANUFACTURING THE SAME

CROSS-REFERENCE TO RELATED APPLICATION

This application claims priority to Japanese Patent Application No. 2013-205924, filed on Sep. 30, 2013, which is hereby incorporated by reference in its entirety.

BACKGROUND OF THE INVENTION

1. Field of the Invention

The present disclosure relates to a semiconductor laser element and a method of manufacturing the same.

2. Description of Related Art

There has been a method proposed for recording a chip ID (mark) which indicates a position of the semiconductor chip on the wafer, from which semiconductor chips are singulated (refer to JP 2007-243132 A).

SUMMARY OF THE INVENTION

A fine mark cannot be formed with the method referred to above. Thus, in order to record more information on each semiconductor chip, an increase in the area of the mark is required (which may require a reduction in the number of chips obtained from one wafer).

Thus, an object of certain embodiments of the present invention is to provide a semiconductor laser element which allows a fine mark to be formed and a method of manufacturing the same.

According to certain embodiments, the above problem can be solved as illustrated below.

A semiconductor laser element according to certain embodiments of the present invention includes a substrate, a semiconductor layer formed on a front surface of the substrate, a first electrode formed on a back surface of the substrate, a second electrode formed on a front surface of the semiconductor layer, and a mark for reading predetermined information which is formed on either of the surfaces on which the first electrode or the second electrode is formed, at a position spaced apart from the electrode, in which the mark is made of a metal material and has a thickness smaller than the thickness of the electrode.

A method of manufacturing a semiconductor laser element according to certain embodiments of the present invention includes singulating a semiconductor wafer which has a substrate and a semiconductor layer formed on a front surface of the substrate into individual semiconductor laser elements. The method includes forming a plurality of first electrodes on a back surface of the substrate, forming a plurality of second electrodes on a front surface of the semiconductor layer, forming marks, which allow reading of predetermined information, on either of the surfaces on which the first electrode or the second electrode is formed, at a position spaced apart from the either one of the electrodes, with a metal material and a thickness smaller than the thickness of the electrode, before or after the forming the plurality of the first electrodes and the forming the plurality of the second electrodes, or after either the forming the plurality of the first electrodes or the forming the plurality of the second electrodes, and singulating the semiconductor wafer into individual semiconductor laser elements so that each elements includes the mark, after the forming the plurality of the first electrodes, the forming the plurality of the second electrodes, and the forming the plurality of the marks.

According to certain embodiments of the present invention, the semiconductor laser element which stores a lot more information can be provided at low cost.

BRIEF DESCRIPTION OF THE DRAWINGS

FIGS. 1A to 1C are schematic views showing a semiconductor laser element 100 according to a first embodiment of the present invention, in which FIG. 1A is a perspective view of the semiconductor laser element 100, FIG. 1B is a top view of the semiconductor laser element 100, and FIG. 1C is a bottom view of the semiconductor laser element 100.

FIGS. 2A to 2C are schematic views showing a semiconductor laser element 200 according to a second embodiment of the present invention, in which FIG. 2A is a perspective view of the semiconductor laser element 200, FIG. 2B is a top view of the semiconductor laser element 200, and FIG. 2C is a bottom view of the semiconductor laser element 200.

FIGS. 3A to 3C are schematic views showing a semiconductor laser element 300 according to a third embodiment of the present invention, in which FIG. 3A is a perspective view of the semiconductor laser element 300, FIG. 3B is a top view of the semiconductor laser element 300, and FIG. 3C is a bottom view of the semiconductor laser element 300.

DETAILED DESCRIPTION OF EMBODIMENTS

Embodiments of the present invention will be described below with reference to the accompanying drawings.
Semiconductor Laser Element 100 According to the First Embodiment of the Present Invention FIGS. 1A to 1C are schematic views showing a semiconductor laser element 100 according to the first embodiment of the present invention, in which FIG. 1A is a perspective view of the semiconductor laser element 100, FIG. 1B is a top view of the semiconductor laser element 100, and FIG. 1C is a bottom view of the semiconductor laser element 100.

Figure 1A:
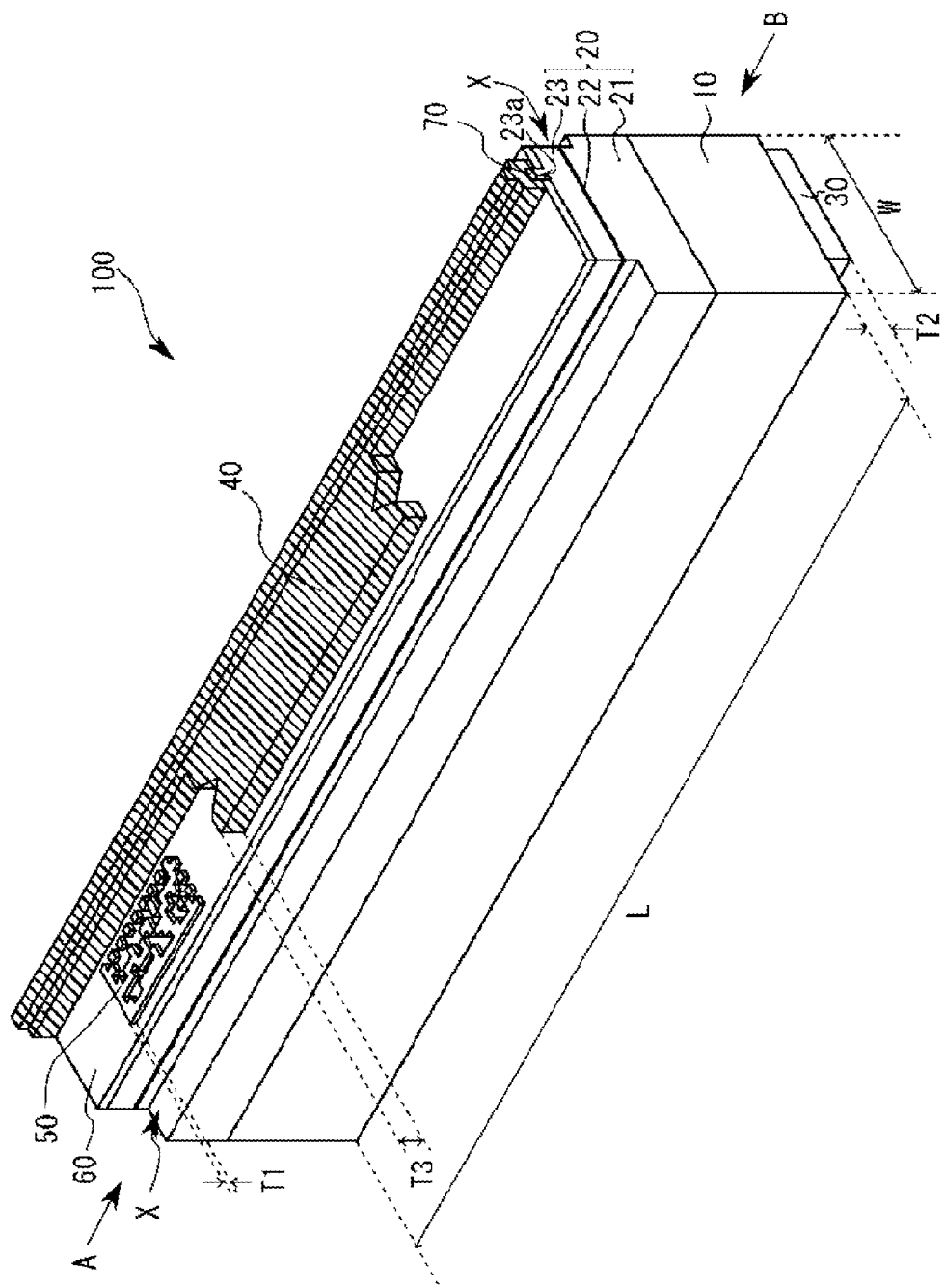

As shown in FIGS. 1A to 1C, the semiconductor laser element 100 according to the first embodiment of the present invention includes a substrate 10, a semiconductor layer 20 formed on a front surface of the substrate 10, a first electrode 30 formed on a back surface of the substrate 10, a second electrode 40 formed on a front surface of the semiconductor layer 20, and a mark 50 for reading predetermined information which is formed on either of the surfaces on which the first electrode or the second electrode is formed, at a position spaced apart from the electrode, in which the mark is made of a metal material and has a thickness smaller than the thickness of the electrode.

Each component will be described below.

Substrate 10

The substrate 10 is a conductive substrate, and made of a semiconductor, for example. For the semiconductor, a nitride semiconductor may be employed. Examples of the nitride semiconductor include $In_XAl_YGa_{1-X-Y}N$ ($0 \leq X$, $0 \leq Y$, $X+Y \leq 1$). Also, GaN may be typically used as $In_XAl_YGa_{1-X-Y}N$ ($0 \leq X$, $0 \leq Y$, $X+Y \leq 1$).

Semiconductor Layer 20

The semiconductor layer 20 is formed on the front surface of the substrate 10. The semiconductor layer 20 may be made of a nitride semiconductor. Examples of the nitride semiconductor include $In_XAl_YGa_{1-X-Y}N$ ($0 \leq X$, $0 \leq Y$, $X+Y \leq 1$). A stacked layer of plurality of layers can be used for the semiconductor layer 20. An example of the semiconductor layer 20 made of laminated stacked layer of plurality of layers includes a first conductivity-type semiconductor layer (such as an n-type layer 21), a light emission layer 22, and a second conductivity-type semiconductor layer (such as a p-type layer 23) in this order on the substrate 10.

A width W of the semiconductor layer 20 (a length in a direction perpendicular to an extending direction L of an optical waveguide in a top view, and the same applies to the following) is 300 μm or less, for example. In the semiconductor laser element 100 of the first embodiment, the width W of the semiconductor layer 20 is equal to a width of the semiconductor laser element 100.

First Electrode 30, Second Electrode 40

The first electrode 30 is formed on the back surface of the substrate 10, and the second electrode 40 is formed on the front surface of the semiconductor layer 20. For example, the first electrode 30 is an n-side electrode, and the second electrode 40 is a p-side pad electrode.

Each of the first electrode 30 and the second electrode 40 is made of a metal material. The metal material is not particularly limited, but for example, Au may be employed for a main metal material of the first electrode 30 and the second electrode 40. In the specification, the term "main metal material" refers to a metal material used in a thickest layer, in the case where the first electrode 30 or the second electrode 40 is made of multiple layers, for example. For example, in the case where the second electrode 40 is made of multiple layers such as three layers of Ni, Pd, and Au stacked in this order on the semiconductor layer 20, and the uppermost layer of Au is thickest, the main metal material of the second electrode 40 is Au. The shape of the second electrode 40 in a plan view is not specifically limited as long as a region for disposing the mark 50 can be secured, but as shown in FIG. 1B, in the case where the second electrode 40 has a projection portion, which has a large width, in the vicinity of a center of the element, the mark 50 can be formed on either the light emission end face A side or the light reflection end face B side, so that the formation position of the mark 50 can be easily changed. Furthermore, the projection portion of the second electrode 40 can be used as a guide at the time of wire bonding. In the specification, the term "width of the second electrode 40" refers to a length in the same direction as that of the width W of the semiconductor layer 20.

Mark 50

Surface on which Mark 50 is Formed

The mark 50 is formed on either of the surfaces on which the first electrode 30 or the second electrode 40 is formed.

The term "on the surface" refers that the mark 50 may be directly formed on either of the surfaces on which the first electrode 30 or the second electrode 40 is formed, or that the mark 50 may be formed on the surface on which the electrodes is formed with another member (such as insulating film 60) interposed between the mark 50 and the surface.

In the case where the mark 50 is formed on the surface having the second electrode 40 (that is, on the front surface of the semiconductor layer 20) via the insulating film 60 (see FIGS. 1A to 1C), the mark 50 is not in contact with the surface on which the electrode is formed, so that it is possible to prevent an electrical defect due to the mark 50 made of the metal material. Examples of the insulating film 60 include a $SiO_2$ film, a SiN film, and $ZrO_2$ film.

In the case where the mark 50 is formed on the surface having the first electrode 30 (that is, on the back surface of the substrate 10), the mark 50 may be formed via an insulating film formed in a region except for at least a region on which the first electrode 30 is formed, or the mark 50 may be directly formed on the back surface of the substrate 10 without disposing the insulating film. Usually in the semiconductor laser element, an insulating layer is not provided on the back surface of the substrate 10, so that disposing the mark 50 directly on the back surface of the substrate 10 can eliminate operations other than disposing of the mark 50 in this stage of the manufacturing.

Position of Mark 50

The mark 50 is formed at a position spaced apart from the electrode. In one example in which the mark 50 is positioned spaced apart from the electrode, in the case where the mark 50 is formed on the surface having the second electrode 40, a ridge 23a is formed on the front surface of the semiconductor layer 20, a connection portion of the second electrode 40 to be connected to an external power supply is arranged on one of two portions of a surface region of the semiconductor layer 20 sectioned by the ridge 23a, and the mark 50 is arranged on the side where the connection portion is arranged in the surface region of the semiconductor layer 20 sectioned by the ridge 23a (see FIGS. 1A to 1C). According to the example, it becomes possible to reduce the area of the other portion of the surface region of the semiconductor layer 20 sectioned by the ridge 23a in which the second electrode 40 and the mark 50 are not arranged so as to reduce the width of the semiconductor laser element 100. Thus, the number of the elements which can be obtained from the one wafer can be increased. The connection portion of the second electrode 40 is a portion connected to a wire or the like, generally formed with a larger width than other portions. In the first embodiment of the present invention, as shown in FIG. 1B, the projection portion of the second electrode 40 is the connection portion.

In another example in which the mark 50 is positioned spaced apart from the electrode, in the case where the mark 50 is formed on the surface having the second electrode 40, the mark 50 is formed closer to the light emission end face A than to the light reflection end face B (see FIGS. 1A to 1C). According to the example light emitted from the semiconductor later element 100 other than the light traveling along the light guide is absorbed by the mark 50, so that the semiconductor laser element 100 can be provided to hardly generate a ripple in a far-field pattern (FFP) of a laser light.

Figure 3A:
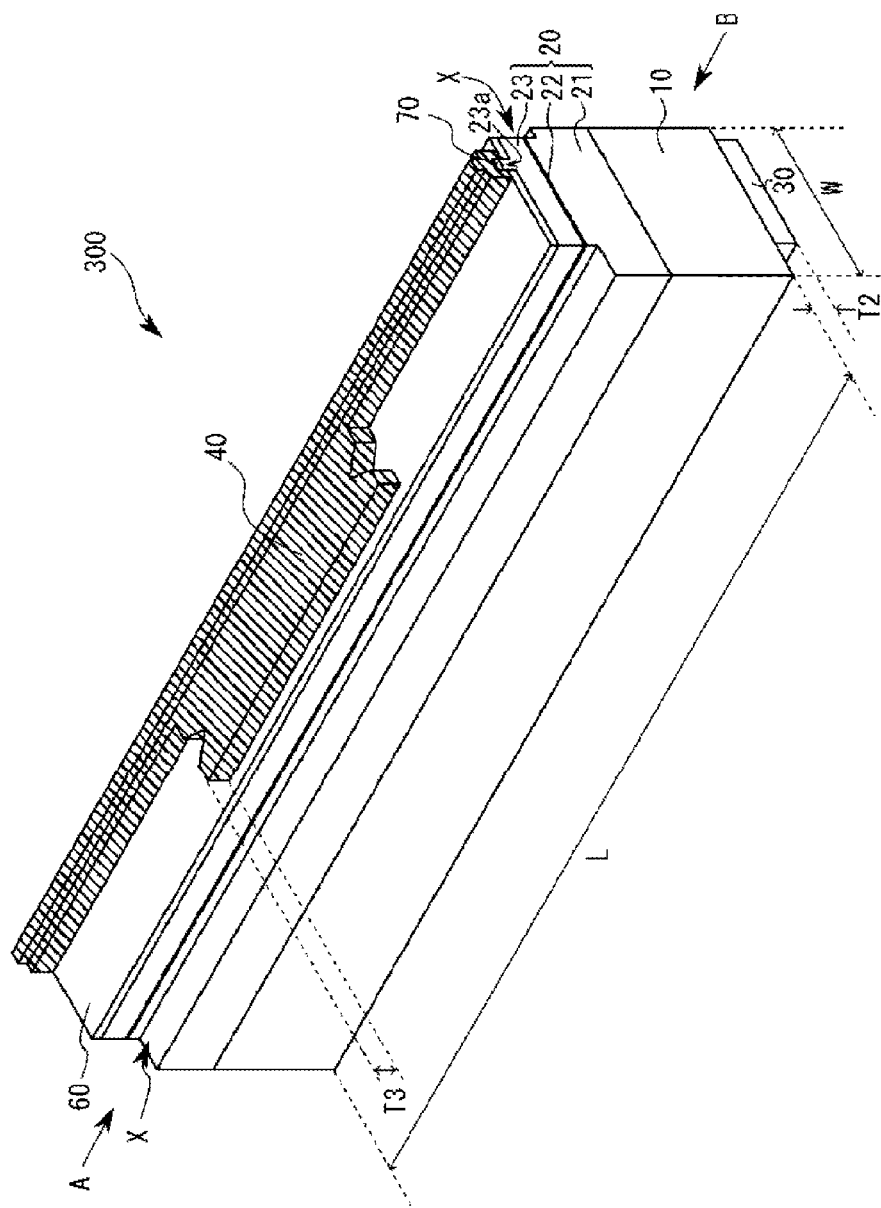
Figure 3C:
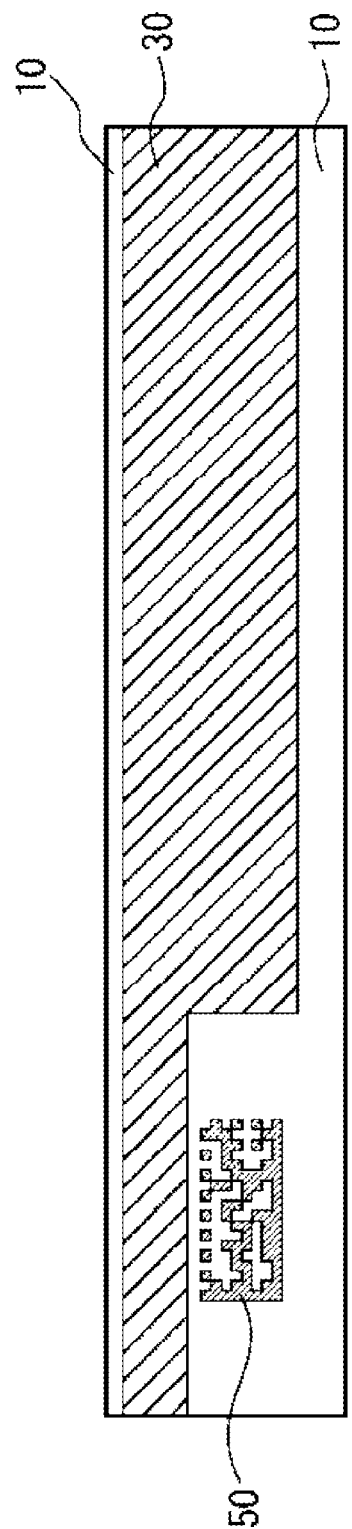

In another example in which the mark 50 is positioned spaced apart from the electrode, in the case where the mark 50 is formed on the surface having the first electrode 30, the first electrode 30 is formed so as to have a projection portion (having a large width) in the planar view, and the mark 50 is formed in a region in which the first electrode 30 is not formed on the back surface of the substrate 10 (see FIGS. 2A to 2C), or the first electrode 30 is formed in almost the whole region on the back surface of the substrate 10 other than the region in which the mark 50 is formed (see FIGS. 3A to 3C).

Shape of Mark 50

The mark 50 is formed into a shape which allows reading of predetermined information. Examples of the mark 50 include a two-dimensional code and a several-digit numbers. The mark 50 shown in FIG. 1B is an example of the two-dimensional code serving as a data matrix in which two adjacent sides of four sides in a rectangular shape are linear alignment patterns. In FIG. 1B, the alignment pattern is disposed close to the end face of the element, but the alignment pattern may disposed close to the center of the element. Further, examples of the predetermined information include position information in the semiconductor wafer 400 before the semiconductor laser elements 100 are singulated into individual pieces. The position information may show which row and column the element is positioned. In the case where an element is formed from a two-inch wafer so as to have a width of about 100 μm to about 200 μm, the number of rows and the columns will be two or more digits. According to the first embodiment of the present invention, the mark 50 having a fine shape can be formed, so that even when the mark 50 has the large amount of information as described above, it can be formed in a limited region. The information stored in the mark 50 can be read in such a manner that, for example, an image that is photographed optically is decoded by a reading apparatus (a reading apparatus for reading a two-dimensional code, for example).

Material of Mark 50

The mark 50 is made of a metal material. Thus, it becomes possible to optically take a photograph in which light and darkness are clearly distinguished (photograph with high contrast), compared with a case where the mark 50 is made of a transparent material such as a resin material, so that the information can be easily read from the mark 50.

The metal material of the mark 50 is not limited, but a metal material other than Au may be employed. Since Au has high ductility, the use of a metal material other than Au can facilitate forming of the mark 50 with a fine shape.

The mark 50 may be made of a metal material which includes a main metal component different from a main metal material of either the first electrode 30 or the second electrode 40. In this case, the mark 50 can be easily distinguished from either the first electrode 30 or the second electrode 40, which facilitates reading of the information from the mark 50. In addition, the first electrode 30 and the second electrode 40 are generally made of an electrode material having high ductility, so that with the use of a metal material different from the material of either the first electrode 30 or the second electrode 40 as a main metal material, the mark 50 having a fine shape can be easily formed.

The expression "the case where the mark 50 is made of a metal material which includes a main metal material different from the main metal material of either the first electrode 30 or the second electrode 40" refers to a case where, for example, the main metal material which is used for either the first electrode 30 or the second electrode 40 is Au, and the mark 50 is made of a metal material which includes a main metal material other than Au (such as Pt).

The expression "main metal material of the mark 50" refers to a metal material used for a thickest layer in the case where the mark 50 is made of multiple layers. For example, in the case where the mark 50 is formed by sequentially stacking two layers of Ni and Pt from the semiconductor layer 20 side, and the uppermost layer of Pt is thickest, Pt is the main metal material of the mark 50.

In a configuration in which the mark 50 is formed with a multilayer structure on a surface having the second electrode 40, the layer which is in contact with the front surface of the semiconductor layer 20 (a surface of the insulating film 60 in the case where the second electrode 40 is formed on the front surface of the semiconductor layer 20 via the insulating film 60) may be made of a material which has good adhesion with the surface of the semiconductor (or the surface of the insulating film 60) and is not reactive with the insulating film 60 (Ni etc., in the case where the insulating film 60 is made of $SiO_2$). In the case where the mark 50 is formed on the surface having the second electrode 40 and is not covered with a protective film, the uppermost layer of the mark 50 is preferably made of a metal material (such as Pt) which is not easily subjected to discoloration and/or deterioration.

Thickness of Mark 50

The mark 50 has a thickness T1 which is smaller than either of the thicknesses T2 or T3 of the first electrode 30 or the second electrode 40 (T1<T2, or T1<T3), respectively. With this, the mark 50 having a fine shape can be easily formed. Also, the mark 50 can be easily distinguished from either the first electrode 30 or the second electrode 40, so that the information can be easily read from the mark 50. In the case where a wire is bonded to either the first electrode 30 or the second electrode 40 by using wire bonding technique, the mark 50 does not obstruct the wire bonding. The use of wire bonding is shown as an example, but is not limited thereto. Further, the semiconductor laser element 100 can be mounted on a submount etc., via an electrically conductive member such as AuSn with a surface opposite to the surface having the mark 50.

In the case where the mark 50 has a thickness T1 which is smaller than either of the thicknesses T2 or T3 of the first electrode 30 or the second electrode 40 (T1<T2, or T1<T3), respectively, for example, the thickness T1 of the mark 50 may be equal to or less than 70%, 50%, or 10% with respect to the thickness T2 or T3 of the electrodes. More specific examples include the case where the thickness T1 of the mark 50 is about 55 nm while the thickness T2 or T3 of either of the electrodes is about 1 μm. Further, in order to form the mark having the fine shape with a higher degree of accuracy, the thickness T1 of the mark 50 is preferably 200 nm or less.

In a configuration in which the mark 50 is formed on the surface having the second electrode 40, and the mark 50 is formed via the insulating film 60, the thickness T3 of the second electrode 40 to be compared with the thickness T1 of the mark 50 is preferably the thickness T3 of the second electrode 40 formed on the insulating film 60. For example, in the case where a contact electrode 70 is formed on an upper surface of the ridge 23a, and a p-side pad electrode 40 is formed so as to extend from the contact electrode 70 toward the insulating film 60, the thickness T1 of the mark 50 is preferably smaller than the thickness T3 of the p-side pad electrode 40 which serves as the second electrode.

Size of Mark 50

The mark 50 may have a size within a range of a rectangle which has a longitudinal dimension of 200 μm and a lateral dimension of 200 μm. In the specification, the longitudinal dimension means a length in the same direction as that of the width W of the semiconductor layer 20, and the lateral dimension means a length in the same direction as the extending direction L of the optical waveguide of the semiconductor laser element 100. Further, the mark 50 may have a shape elongated in the lateral direction along the optical waveguide. In this case, the semiconductor laser element 100 can be made with a width of 200 μm or less, for example, which can increase the number of the elements obtained from a single wafer. Further, the mark 50 has a fine shape which can store a large amount of information, so that even with a size within the above range, lots of information can be recorded in the semiconductor laser element 100. Especially, a two-dimensional code is preferably employed.

In the semiconductor laser element 100 according to the first embodiment described above, the mark 50 is made of a metal material and has a thickness smaller than that of either of the electrodes, so that a fine mark 50 can be formed.

Reduction of the area of the semiconductor layer 20 increases the number of the elements which can be obtained from a single wafer, but an optical waveguide length formed in the length direction of the semiconductor layer 20 is determined by the characteristics of the semiconductor laser element 100, and especially, in the case of GaN-based semiconductor laser elements 100, an optical waveguide length of more than 1 mm has been increasingly employed recently. Therefore, in order to reduce the area of the semiconductor layer 20, the width W of the semiconductor layer 20 is to be reduced instead of the length of the optical waveguide in the extending direction L. However, according to the first embodiment of the present invention, the fine mark 50 can be formed, so that even when the width W of the semiconductor layer 20 is reduced, a lot more information can be recorded in the semiconductor laser element 100.

In addition, according to the semiconductor laser element 100, a step difference X may be provided by partially removing the semiconductor layer 20 in the vicinity of a side surface of the element (for example, in the case where a PN junction of the semiconductor layer 20 on the dislocation dense region is removed in order to prevent a leak current caused in a dislocation dense region of the nitride semiconductor substrate 10). In this case, in the semiconductor laser element 100, a region which allows formation of the mark 50 is relatively reduced. However, according to the first embodiment of the present invention, the fine mark 50 can be formed, so that a lot more information can be recorded even in this small region.

Semiconductor Laser Element 200 According to the Second Embodiment of the Present Invention FIGS. 2A to 2C are schematic views showing a semiconductor laser element 200 according to a second embodiment of the present invention, in which FIG. 2A is a perspective view of the semiconductor laser element 200, FIG. 2B is a top view of the semiconductor laser element 200, and FIG. 2C is a bottom view of the semiconductor laser element 200.

As shown in FIGS. 2A to 2C, according to the semiconductor laser element 200 in the second embodiment of the present invention, the mark 50 is formed on the surface on which the first electrode 30 is formed, which differs from the semiconductor laser element 100 in the first embodiment of the present invention in which the mark 50 is formed on the surface on which the second electrode 40 is formed. According to the semiconductor laser element 100 in the first embodiment of the present invention, the mark 50 is formed on the surface having the second electrode 40, so that the predetermined information can be read from the mark 50 when the semiconductor laser element 100 is used as a face-up mounting element. Meanwhile, according to the semiconductor laser element 200 in the second embodiment of the present invention, the mark 50 is formed on the surface having the first electrode 30, so that predetermined information can be read from the mark 50 when the semiconductor laser element 200 is used as a face-down mounting element. That is, the semiconductor laser element 200 can be used as the face-down mounting element, with the second electrode 40 mounted on a sub-mount via an electrically conductive member and a wire connected to the first electrode 30. Further, as shown in FIG. 2C, in the case where the first electrode 30 has a projection portion having a large width, in the vicinity of a center of the element, the mark 50 can be formed on either side of the light emission end face A or the light reflection end face B, so that the position of the mark 50 can be easily changed. The projection portion of the first electrode 30 may be used as a guide at the time of wire bonding.

Semiconductor Laser Element 300 According to the Third Embodiment of the Present Invention FIGS. 3A to 3C are schematic views showing a semiconductor laser element 300 according to a third embodiment of the present invention, in which FIG. 3A is a perspective view of the semiconductor laser element 300, FIG. 3B is a top view of the semiconductor laser element 300, and FIG. 3C is a bottom view of the semiconductor laser element 300.

As shown in FIGS. 3A to 3C, the semiconductor laser element 300 in the third embodiment of the present invention differs from the semiconductor laser element 200 in the second embodiment of the present invention in a shape of the first electrode 30 formed on the back surface of the substrate 10. According to the semiconductor laser element 300 in the third embodiment of the present invention, the area of the first electrode 30 formed on the back surface of the substrate 10 is larger than that of the semiconductor laser element 200 in the second embodiment of the present invention. This arrangement allows for a plurality of wires to be connected thereto, so that a current can be easily diffused, and heat radiation properties can be improved.

Method of Manufacturing

Figure 4A:
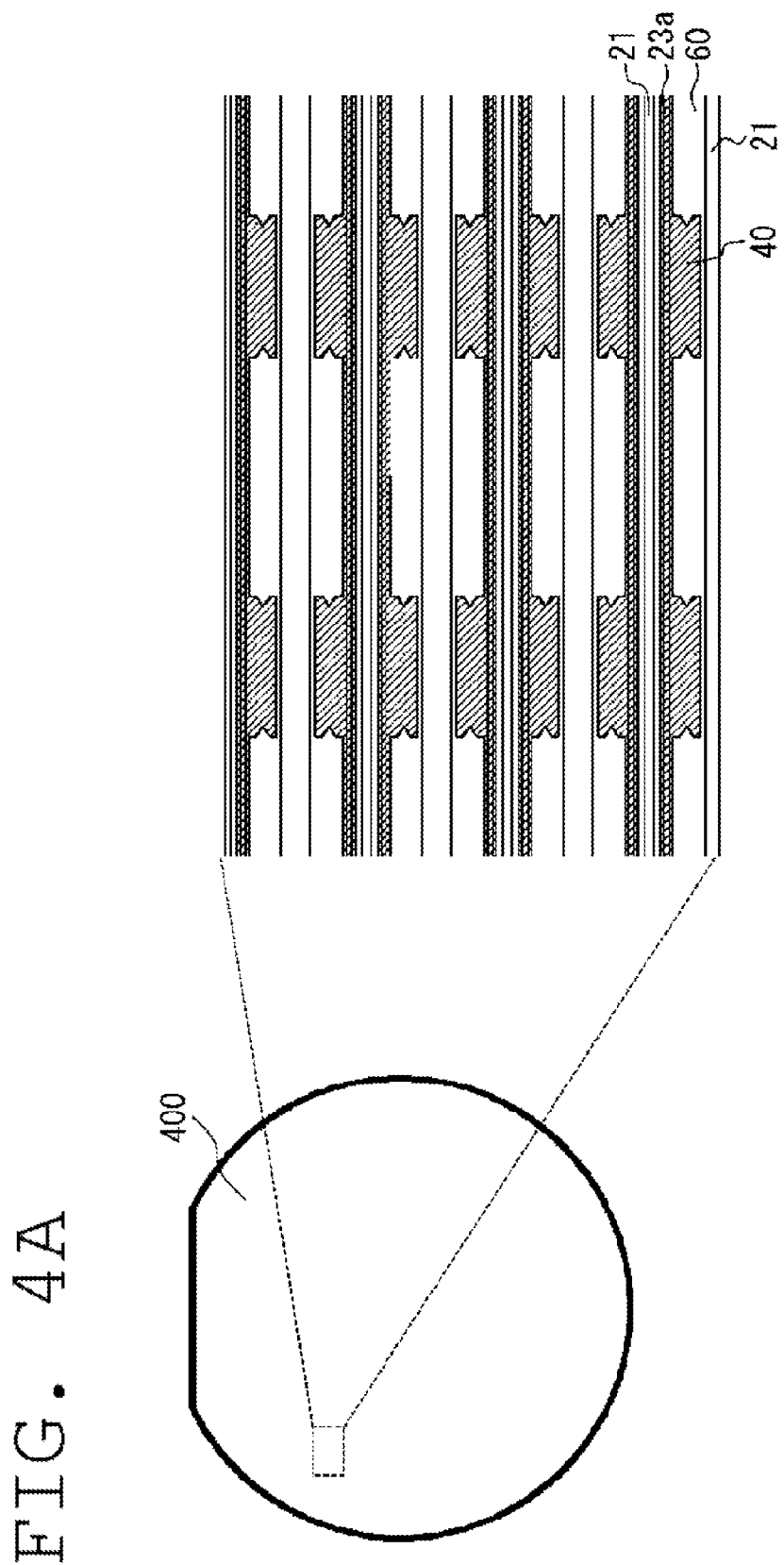
FIG. 4A is a schematic view illustrating one example of a step of a method of manufacturing each of the semiconductor laser elements 100 to 300 according to the first to third embodiments of the present invention showing a semiconductor wafer with a plurality of electrodes formed.
Figure 4B:
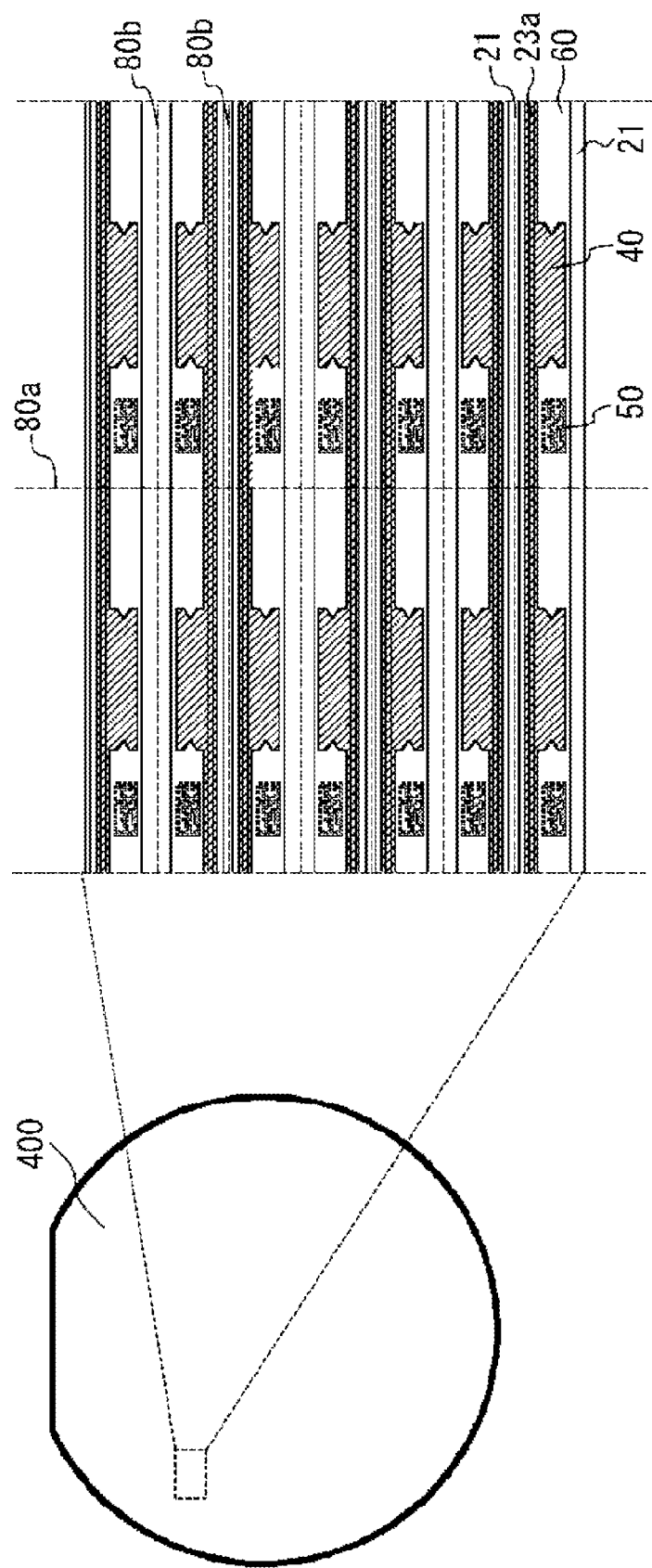
FIG. 4B is a schematic view illustrating one example of a step of a method of manufacturing each of the semiconductor laser elements 100 to 300 according to the first to third embodiments of the present invention showing a semiconductor wafer with a plurality of electrodes formed and a plurality of marks formed.
Figure 4C:
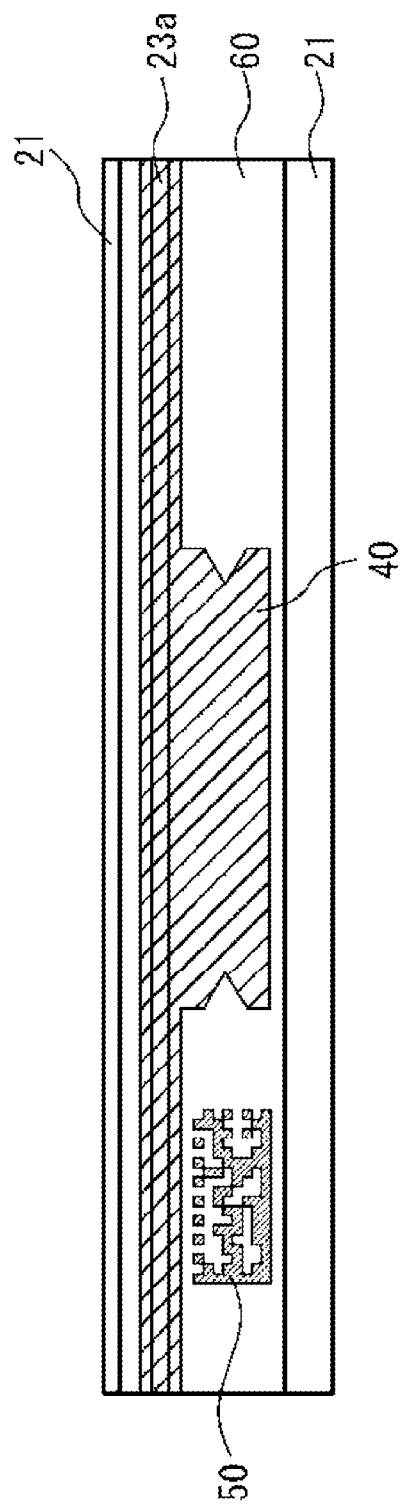
FIG. 4C is a schematic view illustrating one example of a step of a method of manufacturing each of the semiconductor laser elements 100 to 300 according to the first to third embodiments of the present invention showing an individual laser element obtained after singulating the wafer.

FIGS. 4A to 4C are schematic views for describing one example of a method of manufacturing each of the semiconductor laser elements 100 to 300 in the above-described first to third embodiments.

As shown in FIGS. 4A to 4C, each of the semiconductor laser elements 100 to 300 in the above-described first to third embodiments of the present invention can be manufactured by a method including singulating a semiconductor wafer 400 which has a substrate 10 and a semiconductor layer 20 formed on a front surface of the substrate 10 into individual semiconductor laser elements. The method includes forming a plurality of the first electrodes 30 on the back surface of the substrate 10, forming a plurality of the second electrodes 40 on the front surface of the semiconductor layer 20, forming the marks 50 which allow reading of predetermined information and are made of a metal material, with a thickness smaller than the thickness of either the first electrode 30 or the second electrode 40, on the surface on which the electrode is formed, so as to be positioned spaced apart from the electrode, before or after the forming the plurality of the first electrodes and forming the plurality of the second electrodes, or between the forming the plurality of the one electrodes and the forming the plurality of the other electrodes (in other words, after the forming the first electrodes and before the forming the second electrodes, or after the forming the second electrodes and before the forming the first electrodes), and singulating the semiconductor wafer 400 into individual pieces so that the mark 50 is included in each pieces, after the forming the plurality of the first electrodes, the forming the plurality of the second electrodes, and forming the plurality of the marks.

The method will be described below in order of operations.

Forming First Electrodes and Forming Second Electrodes

First, as shown in FIG. 4A, a semiconductor wafer 400 having the substrate 10 and the semiconductor layer 20 formed on the front surface of the substrate 10 is prepared, the plurality of the first electrodes 30 are formed on the back surface of the substrate 10, and the plurality of the second electrodes 40 are formed on the front surface of the semiconductor layer 20. The first electrodes 30 may be formed after forming the second electrodes 40, or vice versa.

Forming Marks

Next, as shown in FIG. 4B, the marks 50 which allow reading of predetermined information and are made of a metal material are formed on either of the surfaces on which the first electrodes 30 or the second electrodes 40 are formed, so as to be positioned spaced apart from the electrodes, with a thickness T1 smaller than the thicknesses T2 or T3 of the electrode (T1<T2, or T1<T3). FIGS. 4A to 4C show an example in the case where the marks 50 are formed on the surfaces on which the second electrodes 40 are formed. Also in FIG. 4B, the plurality of the marks 50 are illustrated with a same pattern, but different patterns may be employed respectively. In the case where position information within the wafer to be recorded in each of the marks 50, as described above, the patterns will be different respectively.

The forming marks may be performed after the forming the first electrodes 30 and the forming the second electrodes 40, or before the forming the first electrodes 30 and the forming the second electrodes 40.

The forming the marks may be performed after the forming the first electrodes and before the forming the second electrodes. Alternatively, the forming the marks may also be performed after the forming the second electrodes and before the forming the first electrodes. That is, the forming the marks may be performed between the forming the one electrodes and the forming the other electrodes. For example, after the second electrodes 40 are formed, the marks 50 are formed, and then the first electrodes 30 are formed.

In the case where the marks 50 are formed on the surfaces on which the second electrodes 40 are formed, before forming the marks, the insulating film 60 may be formed at least on the region other than the region in which the second electrode 40 is formed on the front surface of the semiconductor layer 20, and then, the marks 50 may be formed on the front surface of the semiconductor layer 20 via the insulating film 60.

Singulating

Next, after forming the first electrodes, forming the second electrodes, and forming the marks, the wafer is singulated along dividing lines 80a and 80b shown in FIG. 4B, and the individual pieces are obtained from the semiconductor wafer 400 so that the mark 50 is included in the individual pieces as shown in FIG. 4C.

With the method of manufacturing the semiconductor laser elements according to the embodiments of the present invention, forming the marks is separately performed from forming the first electrodes and forming the second electrodes, so that the marks 50 can be formed respectively with a thickness and material different from those of the first electrodes 30 and the second electrodes 40, respectively, so that it is possible to efficiently manufacture the semiconductor laser elements 100 to 300 according to the first to third embodiments of the present invention.

The embodiments of the present invention described above are respectively of one example of the present invention, and the present invention is not limited to the above descriptions.

What is claimed is:

1. A semiconductor laser element comprising:
a substrate;
a semiconductor layer formed on a front surface of the substrate;
a first electrode formed on a back surface of the substrate;
a second electrode formed on a front surface of the semiconductor layer; and
at least one mark configured to allow reading of predetermined information, the at least one mark being formed in a position on the surface on which the second electrode is formed, spaced apart from the second electrode, wherein the at least one mark is made of a metal material and has a thickness smaller than a thickness of the second electrode,
wherein the second electrode has a connection portion configured to be connected to an external power supply, the connection portion having a larger width than a remainder of the second electrode,
wherein the mark is separated from the connection portion in a length direction of the second electrode,
wherein the front surface of the semiconductor layer has a ridge, and
wherein the connection portion is arranged on one of two portions of a surface region of the semiconductor layer sectioned by the ridge, and the mark is arranged on the same portion of the surface region as the connection portion.

2. The semiconductor laser element according to claim 1, wherein the mark is made of a metal material other than Au.

3. The semiconductor laser element according to claim 1, wherein the mark is made of a metal material including a main metal material that is different from a main metal material of the electrode.

4. The semiconductor laser element according to claim 3, wherein the main metal material of the electrode is Au, and the main metal material of the mark is a metal material other than Au.

5. The semiconductor laser element according to claim 4, wherein the main metal material of the mark is Pt.

6. The semiconductor laser element according to claim 1, wherein the mark has a thickness equal to or less than 50% of the thickness of the electrode that is formed on the surface on which the mark is formed.

7. The semiconductor laser element according to claim 1, wherein the mark is a two-dimensional code.

8. The semiconductor laser element according to claim 1, wherein the predetermined information is position information of the semiconductor laser element in a semiconductor wafer before the semiconductor laser elements are singulated into individual pieces.

9. The semiconductor laser element according to claim 1, wherein the mark is formed closer to a light emission end face than to a light reflection end face.

10. The semiconductor laser element according to claim 1, wherein an insulating film is interposed between the mark and the front surface.

11. A method of manufacturing a semiconductor laser element comprising:
providing a semiconductor wafer having a substrate and a semiconductor layer formed on a front surface of the substrate;
forming a plurality of first electrodes on a back surface of the substrate;
forming a plurality of second electrodes on a front surface of the semiconductor layer, wherein each second electrode has a connection portion configured to be connected to an external power supply, the connection portion having a larger width than a remainder of the second electrode;
forming a plurality of marks configured to allow reading of predetermined information, the plurality of marks being formed in positions on the surface on which the second electrode is formed, spaced apart from the second electrodes, wherein the marks are made of a metal material and have a thickness smaller than a thickness of the electrodes that are formed on the surface on which the marks are formed, and wherein each respective mark is separated from each respective connection portion in a length direction of each respective second electrode; and after forming the plurality of the first electrodes, forming the plurality of the second electrodes, and forming the plurality of the marks, singulating the semiconductor wafer into individual semiconductor laser elements each including at least one of the marks.

12. The method of manufacturing a semiconductor laser element according to claim 11, wherein the mark is made of a metal material with a main metal material different from a main metal material of the electrode.

13. The method of manufacturing a semiconductor laser element according to claim 11, wherein the mark is formed closer to a light emission end face than to a light reflection end face.

14. The method of manufacturing a semiconductor laser element according to claim 11, wherein before forming the mark, an insulating film is formed on the front surface of the semiconductor layer at least in a region other than a region on which the second electrode is formed, and the insulating film is interposed between the mark and the front surface.

15. The method of manufacturing a semiconductor laser element according to claim 11, wherein the plurality of marks are formed before forming the plurality of the first electrodes and forming the plurality of the second electrodes.

16. The method of manufacturing a semiconductor laser element according to claim 11, wherein the plurality of marks are formed after forming the plurality of the first electrodes and forming the plurality of the second electrodes.

17. The method of manufacturing a semiconductor laser element according to claim 11, wherein the plurality of marks are formed after forming the plurality of first electrodes.

18. The method of manufacturing a semiconductor laser element according to claim 11, wherein the plurality of marks are formed after forming the plurality of second electrodes.

19. A semiconductor laser element comprising:
a substrate;
a semiconductor layer formed on a front surface of the substrate;
a first electrode formed on a back surface of the substrate;
a second electrode formed on a front surface of the semiconductor layer; and
at least one mark configured to allow reading of predetermined information, the at least one mark being formed in a position on the surface on which the first electrode is formed, spaced apart from the first electrode,
wherein the at least one mark is made of a metal material and has a thickness smaller than a thickness of the first electrode,
wherein the first electrode has a connection portion configured to be connected to an external power supply, the connection portion having a larger width than a remainder of the second electrode,
wherein the mark is separated from the connection portion in a length direction of the first electrode.

20. A method of manufacturing a semiconductor laser element comprising:
providing a semiconductor wafer having a substrate and a semiconductor layer formed on a front surface of the substrate;
forming a plurality of first electrodes on a back surface of the substrate, wherein each first electrode has a connection portion configured to be connected to an external power supply, the connection portion having a larger width than a remainder of the second electrode;
forming a plurality of second electrodes on a front surface of the semiconductor layer;
forming a plurality of marks configured to allow reading of predetermined information, the plurality of marks being formed in positions on the surface on which the first electrode is formed, spaced apart from the first electrodes, wherein the marks are made of a metal material and have a thickness smaller than a thickness of the electrodes that are formed on the surface on which the marks are formed, and wherein each respective mark is separated from each respective connection portion in a length direction of each respective first electrode; and
after forming the plurality of the first electrodes, forming the plurality of the second electrodes, and forming the plurality of the marks, singulating the semiconductor wafer into individual semiconductor laser elements each including at least one of the marks.

* * * * *